(12) United States Patent
Dong et al.

(10) Patent No.: US 9,472,257 B2
(45) Date of Patent: Oct. 18, 2016

(54) HYBRID MAGNETORESISTIVE READ ONLY MEMORY (MRAM) CACHE MIXING SINGLE-ENDED AND DIFFERENTIAL SENSING

(71) Applicant: QUALCOMM Incorporated, San Diego, CA (US)

(72) Inventors: Xiangyu Dong, San Diego, CA (US); Taehyun Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/278,055

(22) Filed: May 15, 2014

(65) Prior Publication Data

US 2015/0332750 A1 Nov. 19, 2015

(51) Int. Cl.

| | | |
|---|---|---|
| *G11C 11/16* | (2006.01) | |
| *H01L 43/12* | (2006.01) | |
| *H01L 43/08* | (2006.01) | |
| *H01L 43/02* | (2006.01) | |
| *G11C 11/00* | (2006.01) | |
| *G11C 7/06* | (2006.01) | |

(52) U.S. Cl.
CPC .......... *G11C 11/1673* (2013.01); *G11C 11/005* (2013.01); *G11C 11/161* (2013.01); *H01L 43/02* (2013.01); *H01L 43/08* (2013.01); *H01L 43/12* (2013.01); *G11C 7/065* (2013.01); *G11C 7/067* (2013.01)

(58) Field of Classification Search
CPC .................... G11C 11/005; G11C 11/1673
See application file for complete search history.

(56) References Cited

U.S. PATENT DOCUMENTS

| | | | |
|---|---|---|---|
| 5,757,690 A | 5/1998 | McMahon | |
| 6,341,084 B2 * | 1/2002 | Numata et al. | 365/158 |
| 6,359,829 B1 * | 3/2002 | Van Den Berg | 365/232 |
| 7,023,726 B1 * | 4/2006 | Chen et al. | 365/158 |
| 7,272,035 B1 * | 9/2007 | Chen | G11C 11/16 365/158 |
| 7,668,024 B2 | 2/2010 | Chang et al. | |
| 7,719,882 B2 * | 5/2010 | Lin et al. | 365/158 |
| 7,719,896 B1 | 5/2010 | Pesavento et al. | |
| 7,990,792 B2 | 8/2011 | Abe et al. | |
| 8,451,642 B2 | 5/2013 | Seyyedy et al. | |
| 8,593,896 B2 | 11/2013 | Wu | |
| 2007/0121391 A1 | 5/2007 | Gogl et al. | |
| 2014/0025880 A1 | 1/2014 | Yu et al. | |

OTHER PUBLICATIONS

International Search Report and Written Opinion—PCT/US2015/027794—ISA/EPO—Jul. 8, 2015.

(Continued)

*Primary Examiner* — Vanthu Nguyen
(74) *Attorney, Agent, or Firm* — Muncy, Geissler, Olds & Lowe, P.C.

(57) ABSTRACT

A hybrid cache architecture uses magnetoresistive random-access memory (MRAM) caches but has two different types of bit cell sensing. One type of bit cell sensing is single-ended and the other type of bit cell sensing is differential. The result is a uniform bit cell array but a non-uniform sense amplifier configuration.

33 Claims, 5 Drawing Sheets

(56) References Cited

OTHER PUBLICATIONS

Li Y., et al., "C1C: A Configurable, Compiler-Guided STT-RAM L1 Cache", ACM Transactions on Architecture and Code Optimization, Association for Computing Machinery, 2 Penn Plaza, Suite 701, New York NY 10121-0701 USA, vol. 10, No. 4, Dec. 9, 2013 (Dec. 9, 2013), pp. 1-22, XP058036609, ISSN: 1544-3566, DOI: 10.1145/2541228.2555308.

Sun G., et al., "A novel architecture of the 3D stacked MRAM L2 cache for CMPs", High Performance Computer Architecture, 2009. HPCA 2009. IEEE 15th International Symposium on, IEEE, Piscataway, NJ, USA, Feb. 14, 2009 (Feb. 14, 2009), pp. 239-249, XP031435382, ISBN: 978-1-4244-2932-5 chapter 5.2 SRAM-MRAM Hybrid L2 Cache, p. 246-247.

\* cited by examiner

… (1)

HYBRID MAGNETORESISTIVE READ ONLY MEMORY (MRAM) CACHE MIXING SINGLE-ENDED AND DIFFERENTIAL SENSING

FIELD OF DISCLOSURE

Aspects of the present disclosure relate generally to memories and in particular to hybrid magnetoresistive random access memory (MRAM) caches.

BACKGROUND

There are several different types of memory devices and/or systems used in caches for computing environments, each having its own advantages and disadvantages. A static random access memory (SRAM)-based cache is commonly used in applications where access speed and low power are considerations. Magnetoresistive random access memory (MRAM) is commonly used in applications where high bit cell density is advantageous. For example, a magnetoresistive random access memory (MRAM)-based cache can provided approximately four times larger capacity than static random access memory (SRAM)-based cache. However, a magnetoresistive random access memory (MRAM)-based cache tends to be slower than static random access memory (SRAM)-based cache.

It has been proposed to implement the tradeoff between magnetoresistive random access memory (MRAM)-based caches and static random access memory (SRAM)-based caches in hybrid cache architecture. The proposed hybrid cache architecture would include both static random access memory (SRAM)-based and magnetoresistive random access memory (MRAM)-based cache regions. However, this approach is difficult to implement because static random access memory (SRAM) bit cells and magnetoresistive random access memory (MRAM) bit cells are different sizes.

Thus, improved apparatuses and methods for implementing hybrid cache architectures are needed.

SUMMARY

Example implementations of the technology described herein are directed to apparatuses, systems, methods, and computer-readable media for hybrid cache architectures that use solely magnetoresistive random access memory (magnetoresistive random-access memory (MRAM))-based caches but that have two different types of bit cell sensing. One type of bit cell sensing is single-ended and the other type of bit cell sensing is differential. The result is a uniform bit cell array but a non-uniform sense amplifier configuration.

In one or more implementations, an apparatus includes a hybrid cache architecture. The hybrid cache architecture includes a magnetoresistive random-access memory bit cell array. The magnetoresistive random-access memory bit cell array includes a first plurality of magnetoresistive random-access memory bit cells and a second plurality of magnetoresistive random-access memory bit cells coupled to the first plurality of magnetoresistive random-access memory bit cells. The magnetoresistive random-access memory bit cell array also includes a plurality of sense amplifiers. The plurality of sense amplifiers includes a differential sense amplifier and a single-ended sense amplifier. The at least one magnetoresistive random-access memory bit cell in the first plurality of magnetoresistive random-access memory bit cells is coupled to the single-ended sense amplifier. The at least two magnetoresistive random-access memory bit cells in the second plurality of magnetoresistive random-access memory bit cells are coupled to the differential sense amplifier.

In one or more implementations, the magnetoresistive random-access memory bit cell array is uniform and the configuration of the plurality of sense amplifiers is non-uniform. The magnetoresistive random-access memory bit cell array may be a spin torque transfer magnetoresistive random-access memory bit cell array and/or a toggle magnetoresistive random-access memory bit cell array.

In one or more implementations, the single-ended sense amplifier is coupled to a reference cell. In one or more implementations, a portion of the magnetoresistive random-access memory bit cell array that has the first plurality of magnetoresistive random-access memory bit cells coupled to the single-ended sense amplifier may be slower than a portion of the magnetoresistive random-access memory bit cell array that has the second plurality of magnetoresistive random-access memory bit cells coupled to the differential sense amplifier. The single-ended amplifier is coupled to a reference cell.

In one or more implementations, the magnetoresistive random-access memory bit cell array is at least one of a spin torque transfer magnetoresistive random-access memory bit cell array and a toggle magnetoresistive random-access memory bit cell array.

In one or more implementations, the hybrid cache architecture may be integrated in at least one semiconductor die. In one or more implementations, the hybrid cache architecture may be implemented in a device such as a set top box, a music player, a video player, an entertainment unit, a navigation device, a communications device, a personal digital assistant (PDA), a fixed location unit, a computer, or the like.

In one or more implementations, a method for manufacturing a hybrid cache architecture. The method operates by providing a magnetoresistive random-access memory bit cell array for the hybrid cache architecture. Providing a magnetoresistive random-access memory bit cell array for the hybrid cache architecture includes providing a first plurality of magnetoresistive random-access memory bit cells, providing a second plurality of magnetoresistive random-access memory bit cells, and coupling the first plurality of magnetoresistive random-access memory bit cells to the second plurality of magnetoresistive random-access memory bit cells. The method operates further by providing a differential sense amplifier and a single-ended sense amplifier. The method operates further by coupling at least one magnetoresistive random-access memory bit cell in the first plurality of magnetoresistive random-access memory bit cells to the single-ended sense amplifier and at least two magnetoresistive random-access memory bit cells in the second plurality of magnetoresistive random-access memory bit cells to the differential sense amplifier.

In one or more implementations, an apparatus includes a hybrid cache architecture. The hybrid cache architecture includes a magnetoresistive random-access memory bit cell array. The magnetoresistive random-access memory bit cell array includes a first plurality of magnetoresistive random-access memory bit cells and a second plurality of magnetoresistive random-access memory bit cells coupled to the first plurality of magnetoresistive random-access memory bit cells. The magnetoresistive random-access memory bit cell array includes means for sensing, in a differential manner, at least two magnetoresistive random-access memory bit cells in the second plurality of magnetoresistive random-access memory bit cells. The magnetoresistive random-access memory bit cell array also includes means for sensing, in a single-ended manner, at least one magnetoresistive random-access memory bit cell in the first plurality of magnetoresistive random-access memory bit cells.

In one or more implementations, a method for manufacturing a hybrid cache architecture includes step for providing a magnetoresistive random-access memory bit cell array. The step for providing a magnetoresistive random-access memory bit cell array includes step for providing a first plurality of magnetoresistive random-access memory bit cells and a second plurality of magnetoresistive random-access memory bit cells in the hybrid cache architecture. The method includes step for coupling the first plurality of magnetoresistive random-access memory bit cells to the second plurality of magnetoresistive random-access memory bit cells and step for providing a differential sense amplifier and a single-ended sense amplifier. The method includes step for coupling at least one magnetoresistive random-access memory bit cell in the first plurality of magnetoresistive random-access memory bit cells to the single-ended sense amplifier and at least two magnetoresistive random-access memory bit cells in the second plurality of magnetoresistive random-access memory bit cells to the differential sense amplifier.

A computer-readable media, which may be non-transitory, may implement one or more of the methods described herein. Moreover, the hybrid cache architecture may be implemented in a wired or wireless device.

Above is a simplified Summary relating to one or more implementations described herein. As such, the Summary should not be considered an extensive overview relating to all contemplated aspects and/or implementations, nor should the Summary be regarded to identify key or critical elements relating to all contemplated aspects and/or implementations or to delineate the scope associated with any particular aspect and/or implementation. Accordingly, the Summary has the sole purpose of presenting certain concepts relating to one or more aspects and/or implementations relating to the mechanisms disclosed herein in a simplified form to precede the detailed description presented below.

BRIEF DESCRIPTION OF THE DRAWINGS

The accompanying drawings are presented to aid in the description of the technology described herein and are provided solely for illustration of the implementations and not for limitation of the implementations.

DETAILED DESCRIPTION

In general, the subject matter disclosed herein is directed to systems, methods, apparatuses, and computer-readable media for implementing hybrid cache architecture. The hybrid cache architecture uses only magnetoresistive random-access memory (MRAM) bit cells but with two different sensing schemes, one for a slow cache region and one for a fast cache region. The bit cells with normal single-ended sensing form the slower, but denser cache region. The bit cells with differential sensing form the faster cache region. The single-ended versus differential sensing provides a non-uniform sense amplifier configuration even though the magnetoresistive random-access memory (MRAM) bit cell array is uniform.

Figure 1:
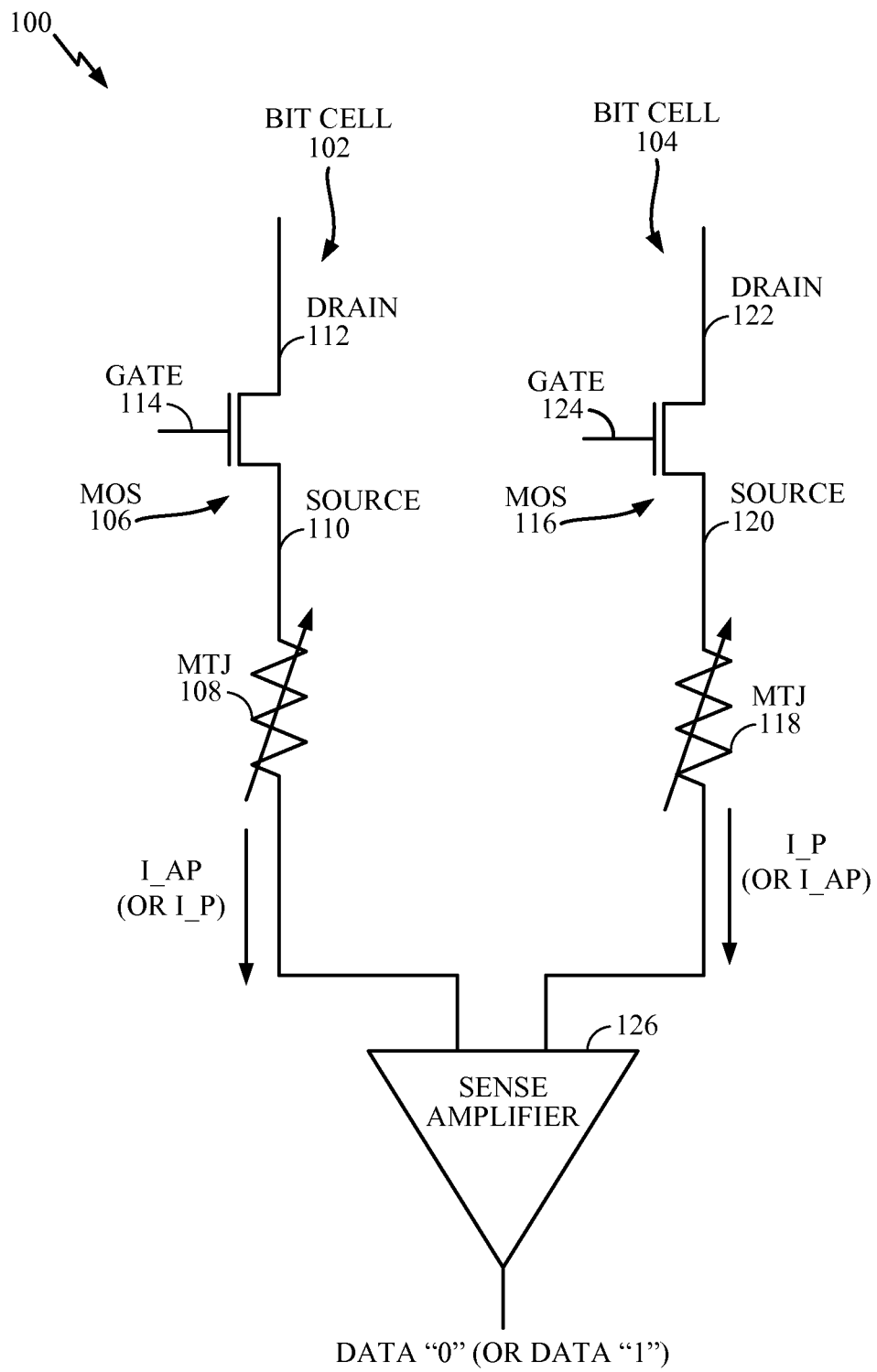
FIG. 1 is a schematic diagram of differential sensing of two magnetoresistive random-access memory (MRAM) bit cells according to one or more implementations of the technology described herein.

FIG. 1 is a schematic diagram of a differential sensing circuitry 100 according to one or more implementations of the technology described herein. The illustrated circuitry 100 includes a magnetoresistive random-access memory (MRAM) bit cell 102 and a magnetoresistive random-access memory (MRAM) bit cell 104.

The illustrated magnetoresistive random-access memory (MRAM) bit cell 102 includes a metal oxide semiconductor (MOS) transistor 106 and a magnetic tunnel junction (MTJ) 108. The metal oxide semiconductor (MOS) transistor 106 includes a source 110, a drain 112, and a gate 114.

The illustrated magnetoresistive random-access memory (MRAM) bit cell 104 includes a metal oxide semiconductor (MOS) transistor 116 and a magnetic tunnel junction (MTJ) 118. The metal oxide semiconductor (MOS) transistor 116 includes a source 120, a drain 122, and a gate 124. The differential sensing circuitry 100 also includes a differential sense amplifier 126, which may be configured to differentially sense the magnetoresistive random-access memory (MRAM) bit cell 102 and the magnetoresistive random-access memory (MRAM) bit cell 104.

In one or more implementations, the magnetic tunnel junction (MTJ) 108 has two layers of magnetic material separated by a thin insulator. The magnetization direction of one magnetic layer is fixed and the magnetization direction of the other magnetic layer is free, i.e., the magnetization direction can be changed by applying a voltage or current to the magnetic tunnel junction (MTJ) 108. When the magnetization directions of the fixed and the free layers are opposite or antiparallel, the magnetic tunnel junction (MTJ) 108 has a higher resistance than when the magnetization directions of the fixed and free layers are parallel.

The resistance of the magnetic tunnel junction (MTJ) 108 can be measured by applying a small read current to the magnetic tunnel junction (MTJ) 108. The magnetic tunnel junction (MTJ) 108 can represent a digital "0" in one magnetic state and represent a digital "1" in the other magnetic state. It is in this manner that the magnetic tunnel junction (MTJ) 108 can be used as a memory element.

In one or more implementations, the magnetic tunnel junction (MTJ) 118 operates similarly to the magnetic tunnel junction (MTJ) 108. For example, the magnetic tunnel junction (MTJ) 118 also has two layers of magnetic material separated by a thin insulator. The magnetization direction of one magnetic layer is fixed and the magnetization direction of the other magnetic layer can be changed by applying a voltage or current to the magnetic tunnel junction (MTJ) 118. When the magnetization directions of the fixed and the free layers are opposite or antiparallel, the magnetic tunnel junction (MTJ) 118 has a higher resistance than when the magnetization directions of the fixed and free layers are parallel.

The resistance of the magnetic tunnel junction (MTJ) 118 can be measured by applying a small read current to the magnetic tunnel junction (MTJ) 118. The magnetic tunnel junction (MTJ) 118 can represent a digital "0" in one magnetic state and represent a digital "1" in the other magnetic state. It is in this manner that the magnetic tunnel junction (MTJ) 118 can be used as a memory element as well.

Reading the polarization state of the magnetoresistive random-access memory (MRAM) bit cell 102 is accomplished by measuring the electrical resistance of the magnetic tunnel junction (MTJ) 108. The magnetoresistive random-access memory (MRAM) bit cell 102 may be selected by powering the metal oxide semiconductor (MOS) transistor 106, which switches current from a bit line (not shown) through the magnetic tunnel junction (MTJ) 108 to the source line 110. If the magnetization state of the magnetic tunnel junction (MTJ) 108 is antiparallel, the differential sense amplifier 126 senses the antiparallel current I_AP from the magnetoresistive random-access memory (MRAM) bit cell 102.

Reading the polarization state of the magnetoresistive random-access memory (MRAM) bit cell 104 is accomplished by measuring the electrical resistance of the magnetic tunnel junction (MTJ) 118. Magnetoresistive random-access memory (MRAM) bit cell 104 may be selected by powering the metal oxide semiconductor (MOS) transistor 116, which switches current from a bit line (not shown) through the magnetic tunnel junction (MTJ) 118 to the source 120. If the magnetization state of the magnetic tunnel junction (MTJ) 118 is parallel, the differential sense amplifier 126 senses the parallel current I_P from the magnetoresistive random-access memory (MRAM) bit cell 104.

For purposes of explanation, assume that the magnetization state of the magnetic tunnel junction (MTJ) 108 is parallel and the magnetoresistive random-access memory (MRAM) bit cell 102 stores a "0." Assume further that the magnetization state of the magnetic tunnel junction (MTJ) 118 is antiparallel and the magnetoresistive random-access memory (MRAM) bit cell 104 stores a "1." In one or more implementations, in the differential sensing scheme the differential sense amplifier 126 senses the "parallel" current I_P from the magnetoresistive random-access memory (MRAM) bit cell 102 and the "antiparallel" current I_AP from the magnetoresistive random-access memory (MRAM) bit cell 104. The differential sense amplifier 126 then compares the two currents and outputs DATA "0" or DATA "1" depending on the difference between the "parallel" current I_P from the magnetoresistive random-access memory (MRAM) bit cell 102 and the "antiparallel" current I_AP from the magnetoresistive random-access memory (MRAM) bit cell 104.

Conventionally, magnetoresistive random-access memory (MRAM) bit cells are arranged in a matrix of hundreds or thousands of bit cells. A write line (not shown) spans the magnetoresistive random-access memory (MRAM) bit cells. During a "write" operation, a current pulse may be used to program a particular magnetoresistive random-access memory (MRAM) bit cell. During a "read" operation, an isolation transistor for the magnetoresistive random-access memory (MRAM) bit cell is turned on to bias the magnetic tunnel junction (MTJ) and the resulting currents (i.e., current from the magnetic tunnel junction (MTJ) and a reference current) are compared to each other to determine whether the resistance of the magnetic tunnel junction (MTJ) is low or high (e.g., the magnetic tunnel junction (MTJ) is programmed to a logical "0" or a logical "1").

Figure 2:
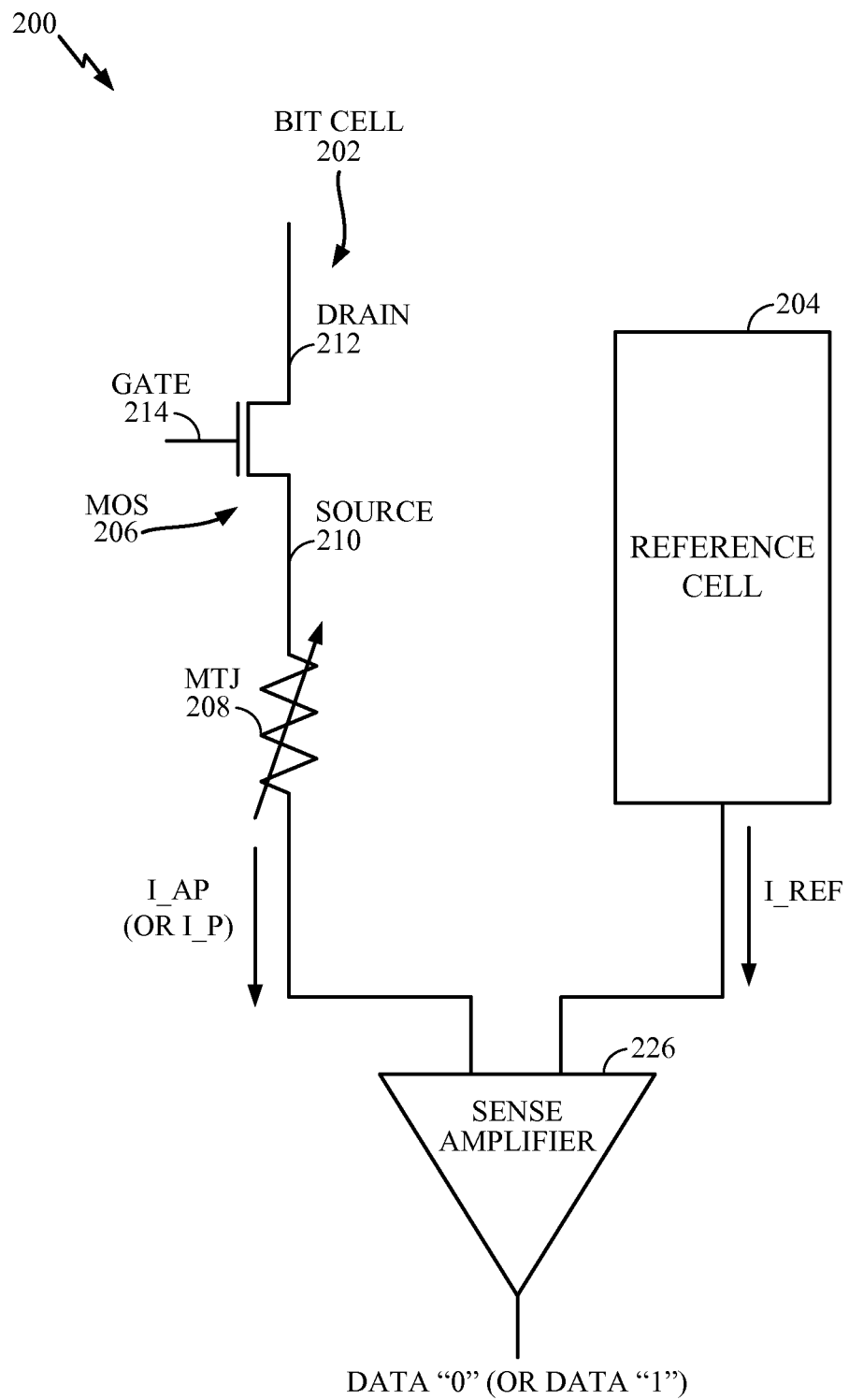
FIG. 2 is a schematic diagram of single-ended sensing of two magnetoresistive random-access memory (MRAM) bit cells according to one or more implementations of the technology described herein.

FIG. 2 is a schematic diagram of single-ended sensing circuitry 200 that operates conventionally. The illustrated single-ended sensing circuitry 200 includes a magnetoresistive random-access memory (MRAM) bit cell 202 and a reference cell 204. The illustrated magnetoresistive random-access memory (MRAM) bit cell 202 includes a metal oxide semiconductor (MOS) transistor 206 and a magnetic tunnel junction (MTJ) 208. The metal oxide semiconductor (MOS) transistor 206 includes a source 210, a drain 212, and a gate 214. The single-ended sensing circuitry 200 also includes a single-ended sense amplifier 226.

The single-ended sense amplifier 226 compares the current (I_AP or I_P) from the magnetic tunnel junction (MTJ) 208 and the current (I_REF) from the reference cell 204 to determine whether a data bit "0" (DATA "0") or a data bit "1" (DATA "1") is stored in the magnetic tunnel junction (MTJ) 208. The reference current (I_REF) is equal to (I_AP)+(I_P)/2.

Figure 3:
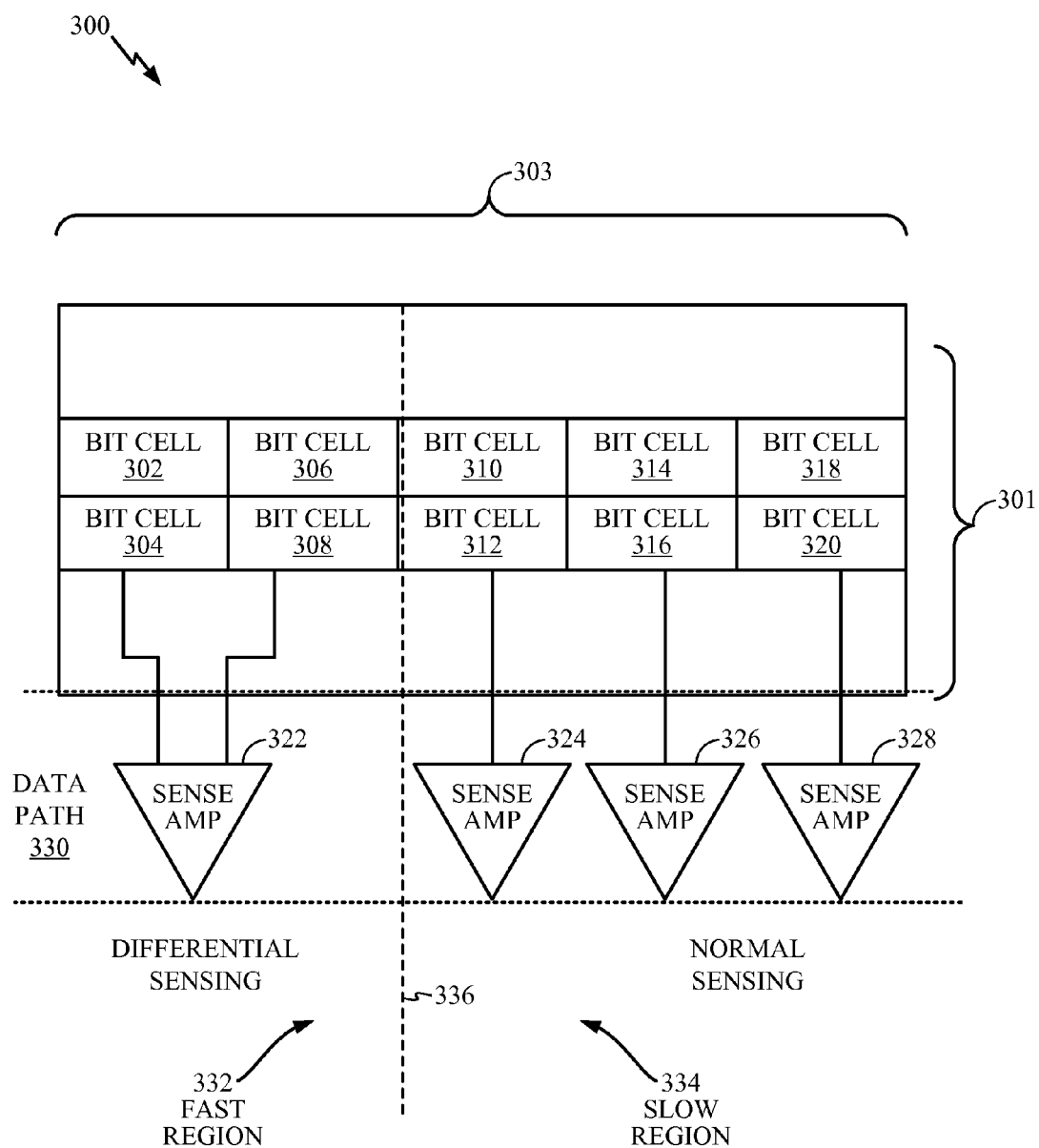
FIG. 3 is a schematic diagram of hybrid cache architecture according to one or more implementations of the technology described herein.

FIG. 3 is a schematic diagram of hybrid cache architecture 300 according to one or more implementations of the technology described herein. In the illustrated implementation, the architecture 300 includes an array of rows 301 and columns 303. A first column includes a magnetoresistive random-access memory (MRAM) bit cell 302 and a magnetoresistive random-access memory (MRAM) bit cell 304. A second column includes a magnetoresistive random-access memory (MRAM) bit cell 306 and a magnetoresistive random-access memory (MRAM) bit cell 308. A third column includes a magnetoresistive random-access memory (MRAM) bit cell 310 and a magnetoresistive random-access memory (MRAM) bit cell 312. A fourth column includes a magnetoresistive random-access memory (MRAM) bit cell 314 and a magnetoresistive random-access memory (MRAM) bit cell 316. A fifth column includes a magnetoresistive random-access memory (MRAM) bit cell 318 and a magnetoresistive random-access memory (MRAM) bit cell 320.

In the illustrated implementation, the magnetoresistive random-access memory (MRAM) bit cells 302 and 304 are coupled to one input of a differential sense amplifier 322, and magnetoresistive random-access memory (MRAM) bit cells 306 and 308 are coupled to the other input of the differential sense amplifier 322. The magnetoresistive random-access memory (MRAM) bit cells 310 and 312 are coupled to the single-ended sense amplifier 324. The magnetoresistive random-access memory (MRAM) bit cells 314 and 316 are coupled to the single-ended sense amplifier 326. The magnetoresistive random-access memory (MRAM) cells 318 and 320 are coupled to the single-ended sense amplifier 328.

The magnetoresistive random-access memory (MRAM) bit cells 302, 304, 306, and 308 along with the differential sense amplifier 322 form a differential sensing fast region 332 of the architecture 300. The magnetoresistive random-access memory (MRAM) bit cells 310, 312, 314, 316, 318, and 320 along with single-ended sense amplifiers 324, 326, and 328 form a normal sensing slow region 334 of the architecture 300.

Note that the array of magnetoresistive random-access memory (MRAM) bit cells is uniform however, the configuration of the sense amplifiers is non-uniform. That is, each column in the array of magnetoresistive random-access memory (MRAM) bit cells may include the same number of magnetoresistive random-access memory (MRAM) bit cells whereas there may be a different number of magnetoresistive random-access memory (MRAM) bit cells associated with each sense amplifier. In the illustrated implementation, there are four magnetoresistive random-access memory (MRAM) bit cells 302, 304, 306, and 308 associated with the sense amplifier 322 and two magnetoresistive random-access memory (MRAM) bit cells 310 and 312 associated with the sense amplifier 324.

In one or more implementations, the hybrid cache architecture 300 may be implemented in at least one semiconductor die. Additionally, in one or more implementations, the hybrid cache architecture 300 may be implemented in a device such as a set top box, a music player, a video player, an entertainment unit, a navigation device, a communications device, a personal digital assistant (PDA), a fixed location unit, a computer, or the like.

Figure 4:
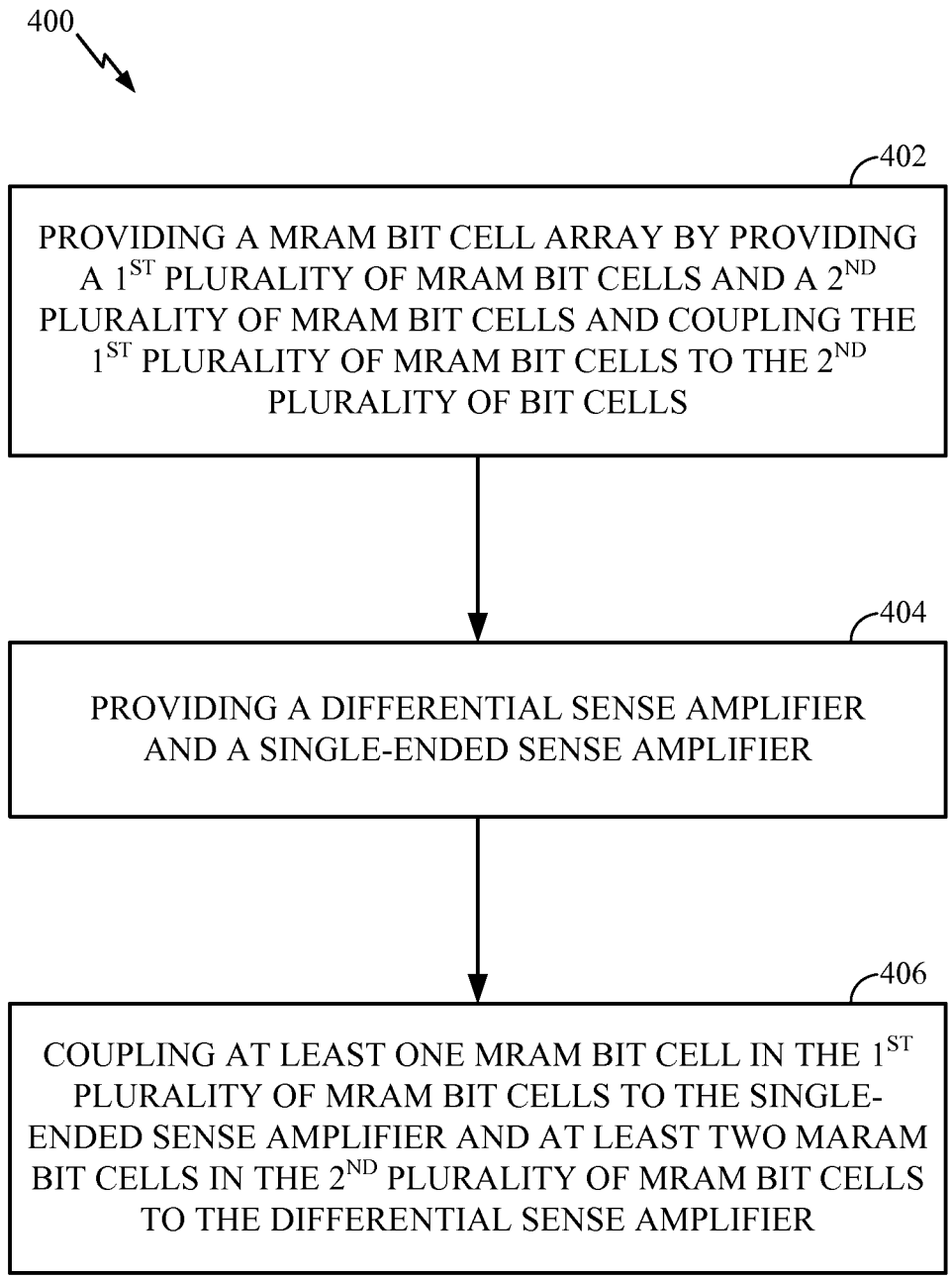
FIG. 4 is a flowchart of a method of making of hybrid cache architecture according to one or more implementations of the technology described herein.

FIG. 4 is a flowchart of a method 400 for making a hybrid cache architecture, such as the hybrid cache architecture 300, according to one or more implementations of the technology described herein. In a block 402, the method 400 provides a magnetoresistive random-access memory (MRAM) bit cell array. This can be implemented by providing a first plurality of magnetoresistive random-access memory (MRAM) bit cells and a second plurality of magnetoresistive random-access memory (MRAM) bit cells, and coupling them to each other. In one or more implementations, the second plurality of magnetoresistive random-access memory (MRAM) bit cells includes those associated with magnetoresistive random-access memory (MRAM) bit cells 302, 304, 306, and 308, and the first plurality of magnetoresistive random-access memory (MRAM) bit cells includes those associated with magnetoresistive random-access memory (MRAM) bit cells 310, 312, 314, 316, 318, and 320.

In a block 404, the method 400 provides a differential sense amplifier and a single-ended sense amplifier. In one or more implementations, the method 400 provides the differential sense amplifier 322 and the single-ended sense amplifiers 324, 326, and 328.

In a block 406, the method 400 couples at least one magnetoresistive random-access memory (MRAM) bit cell from the first plurality of magnetoresistive random-access memory (MRAM) bit cells to the single-ended sense amplifier and at least two magnetoresistive random-access memory (MRAM) bit cells from the second plurality of magnetoresistive random-access memory (MRAM) bit cells to the differential sense amplifier. In one or more implementations, the method 400 couples magnetoresistive random-access memory (MRAM) bit cell 310 to single-ended sense amplifier 324 and couples the magnetoresistive random-access memory (MRAM) bit cells 302 and 306 to the differential sense amplifier 322.

In one or more implementations, the hybrid cache architecture 300 may be implemented in at least one semiconductor die. In one or more implementations, the method 400 may be implemented using a general-purpose processor, microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. The processor may be used for processing information. The processor may be supplemented by, or incorporated in, special purpose logic circuitry.

Figure 5:
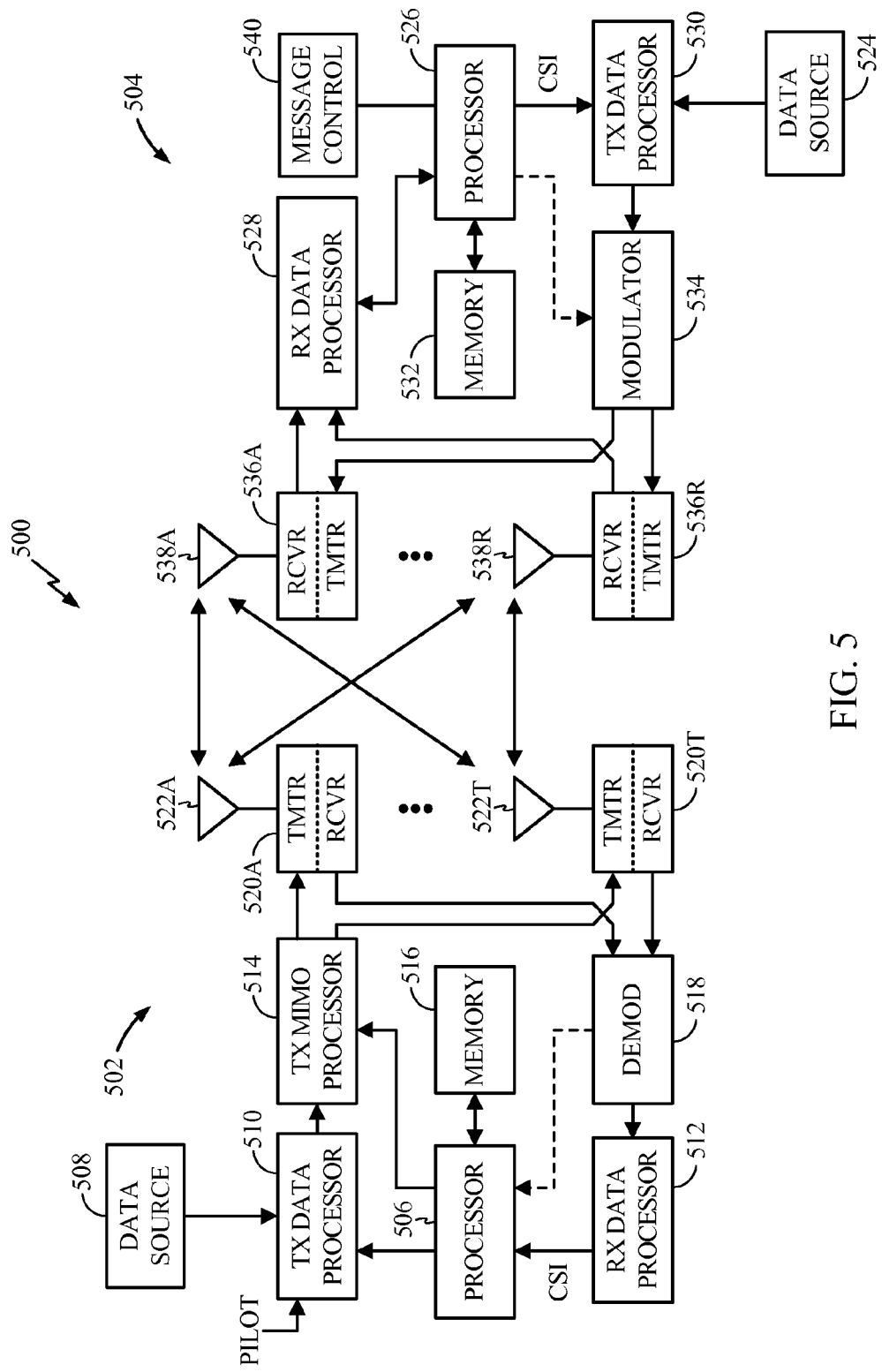
FIG. 5 is a wireless network wherein the technology disclosed herein may be deployed according to implementations described herein.

FIG. 5 is a block diagram of a broadband wireless network 500 according to an example implementation of the technology described herein, in which the architecture 300 may be implemented. The broadband wireless network 500 includes a user device 502 and a base station 504.

In the illustrated implementation, the user device 502 includes a processor 506, a data source 508, a transmit (TX) data processor 510, a receive (RX) data processor 512, a transmit (TX) (multiple-input multiple-output (MIMO) processor 514, a memory 516, a demodulator (DEMOD) 518, several transceivers 520A through 520T, and several antennas 522A through 522T.

In the illustrated implementation, the base station 504 includes a data source 524, a processor 526, a receive data processor 528, a transmit data processor 530, a memory 532, a modulator 534, several transceivers 536A through 536R, several antennas 538A through 538R, and a message control module 540.

The illustrated user device 502 may comprise, be implemented as, or known as user equipment, a subscriber station, a subscriber unit, a mobile station, a mobile, a mobile node, a remote station, a remote terminal, a user terminal, a user agent, a user device, or some other terminology. In some implementations, the user device 502 may be a cellular telephone, a cordless telephone, a session initiation protocol (SIP) phone, a wireless local loop (WLL) station, a personal digital assistant (PDA), a handheld device having wireless connection capability, or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music device, a video device, or a satellite radio), a global positioning system device, or any other suitable device that is configured to communicate via a wireless medium.

The illustrated base station 504 may comprise, be implemented as, or known as a NodeB, an eNodeB, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other similar terminology.

The illustrated data source 508 provides traffic for a number of data streams to the transmit (TX) data processor 510.

The transmit (TX) data processor 510 formats, codes, and interleaves the traffic data for each data stream based on a particular coding scheme selected for that data stream to provide coded data. The coded data for each data stream may be multiplexed with pilot data using OFDM techniques.

The pilot data is commonly a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols.

The data rate, coding, and modulation for each data stream may be determined by instructions performed by the processor 510. The memory 516 may store program code, data, and other information used by the processor 510 or other components of the user device 502.

The modulation symbols for all data streams are then provided to the TX MIMO processor 514, which may further process the modulation symbols (e.g., for OFDM). The TX MIMO processor 514 then provides $N_T$ modulation symbol streams to the $N_T$ transceivers (XCVR) 520A through 520T. In some implementations, the TX MIMO processor 514 applies beam-forming weights to the symbols of the data streams and to the antenna from which the symbol is being transmitted.

Each transceiver (XCVR) 520A through 520T receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transceivers (XCVR) 520A through 520T are then transmitted from $N_T$ antennas 522A through 522T, respectively.

At the base station 504, the transmitted modulated signals are received by $N_R$ antennas 538A through 538R and the received signal from each antenna 538A through 538R is provided to a respective transceiver (XCVR) 536A through 536R. Each transceiver (XCVR) 536A through 536R conditions (e.g., filters, amplifies, and downconverts) a respective received signal, digitizes the conditioned signal to provide samples, and further processes the samples to provide a corresponding "received" symbol stream.

The receive (RX) data processor 528 then receives and processes the $N_R$ received symbol streams from the $N_R$ transceivers (XCVR) 536A through 536R based on a particular receiver processing technique to provide $N_T$ "detected" symbol streams. The receive (RX) data processor 528 then demodulates, deinterleaves, and decodes each detected symbol stream to recover the traffic data for the data stream. The processing by the receive (RX) data processor 528 is complementary to that performed by the transmit (TX) MIMO processor 514 and the transmit (TX) data processor 510 at the user device 502.

The processor 526 periodically determines which pre-coding matrix to use (discussed below). The processor 526 formulates a reverse link message comprising a matrix index portion and a rank value portion.

The data memory 532 may store program code, data, and other information used by the processor 526 or other components of the base station 504.

The reverse link message may comprise various types of information regarding the communication link and/or the received data stream. The reverse link message is then processed by a TX data processor 530, which also receives traffic data for a number of data streams from the data source 524, modulated by the modulator 534, conditioned by the transceivers (XCVR) 536A through 536R, and transmitted back to the user device 502.

At the user device 502, the modulated signals from the base station 504 are received by the antennas 522A through 522T, conditioned by the transceivers (XCVR) 520A through 520T, demodulated by a demodulator (DEMOD) 518, and processed by the RX data processor 512 to extract the reverse link message transmitted by the base station 504. The processor 510 then determines which pre-coding matrix to use for determining the beam-forming weights then processes the extracted message.

It should be appreciated that for the user device 502 and the base station 504 the functionality of two or more of the described components may be provided by a single component. For example, a single processing component may provide the functionality of the message control component 540 and the processor 526.

It also should be appreciated that a wireless node may be configured to transmit and/or receive information in a non-wireless manner (e.g., via a wired connection). Thus, a receiver and a transmitter as discussed herein may include appropriate communication interface components (e.g., electrical or optical interface components) to communicate via a non-wireless medium.

The broadband wireless network 500 may implement any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein may be designed to implement one or more standards, such as IS-97, cdma2000, IS-876, W-CDMA, TDSCDMA, and other standards.

A CDMA network may implement a radio technology such as Universal Terrestrial Radio Access (UTRA), cdma2000, or some other technology. UTRA includes W-CDMA and Low Chip Rate (LCR). The cdma2000 technology covers IS-2000, IS-97, and IS-876 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein may be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2).

Although certain aspects of the disclosure may be described using 3GPP terminology, it is to be understood that the teachings herein may be applied to 3GPP (e.g., Re199, Re17, Re16, Re17) technology, as well as 3GPP2 (e.g., 1xRTT, 1xEV-DO Re10, RevA, RevB) technology and other technologies.

Aspects of the technology described herein are disclosed in the following description and related drawings directed to specific implementations of the technology described herein. Alternative implementations may be devised without departing from the scope of the technology described herein. Additionally, well-known elements of the technology described herein will not be described in detail or will be omitted so as not to obscure the relevant details of the technology described herein.

The term "implementations of the technology described herein" does not require that all implementations of the technology described herein include the discussed feature, advantage, or mode of operation.

The terminology used herein is for the purpose of describing particular implementations only and is not intended to be limiting of implementations of the technology described herein. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many implementations are described in terms of sequences of actions to be performed by, for example, elements of a computing device. It will be recognized that various actions described herein can be performed by specific circuits (e.g., application specific ICs (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the technology described herein may be embodied in a number of different forms, all of which have been contemplated to be within the scope of the claimed subject matter. In addition, for each of the implementations described herein, the corresponding form of any such implementations may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present technology described herein.

The methods, sequences, and/or algorithms described in connection with the implementations disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an implementation of the technology described herein can include a computer-readable media embodying a method of manufacturing a semiconductor device. Accordingly, the technology described herein is not limited to illustrated examples, and any means for performing the functionality described herein are included in implementations of the technology described herein.

While the foregoing disclosure shows illustrative implementations of the technology described herein, it should be noted that various changes and modifications could be made herein without departing from the scope of the technology described herein as defined by the appended claims. The functions, steps, and/or actions of the method claims in accordance with the implementations of the technology described herein described herein need not be performed in any particular order. Furthermore, although elements of the technology described herein may be described or claimed in the singular, the plural is contemplated unless limitation to the singular is explicitly stated.

What is claimed is:

1. An apparatus, comprising:
   a hybrid cache architecture having:
      a magnetoresistive random-access memory bit cell array having a first plurality of magnetoresistive random-access memory bit cells and a second plurality of magnetoresistive random-access memory bit cells coupled to the first plurality of magnetoresistive random-access memory bit cells; and
      a plurality of sense amplifiers having a differential sense amplifier and a single-ended sense amplifier,
   wherein the magnetoresistive random-access memory bit cell array is uniform such that a number of magnetoresistive random-access memory bit cells in each column of the first plurality of magnetoresistive random-access memory bit cells is same as a number of magnetoresistive random-access memory bit cells in each column of the second plurality of magnetoresistive random-access memory bit cells,
   wherein the differential sense amplifier is configured to output a single data bit by sensing currents from at least two magnetoresistive random-access bit cells,
   wherein the single-ended sense amplifier is configured to output a single data bit by sensing a current from a single magnetoresistive random-access bit cell,
   wherein at least one magnetoresistive random-access memory bit cell in the first plurality of magnetoresistive random-access memory bit cells is coupled to the single-ended sense amplifier, and
   wherein at least two magnetoresistive random-access memory bit cells in the second plurality of magnetoresistive random-access memory bit cells are coupled to the differential sense amplifier.

2. The apparatus of claim 1, wherein a configuration for the plurality of sense amplifiers is non-uniform.

3. The apparatus of claim 1, wherein the magnetoresistive random-access memory bit cell array is a Spin Torque Transfer magnetoresistive random-access memory array.

4. The apparatus of claim 1, wherein the magnetoresistive random-access memory bit cell array is a Toggle magnetoresistive random-access memory array.

5. The apparatus of claim 1, wherein the single-ended sense amplifier is further coupled to a reference cell.

6. The apparatus of claim 1, wherein a portion of the magnetoresistive random-access memory bit cell array having the first plurality of magnetoresistive random-access memory bit cells coupled to the single-ended sense amplifier is slower than a portion of the magnetoresistive random-access memory bit cell array having the second plurality of magnetoresistive random-access memory bit cells coupled to the differential sense amplifier.

7. The apparatus of claim 1, wherein the hybrid cache architecture is integrated in at least one semiconductor die.

8. A method for manufacturing a hybrid cache architecture, comprising:
   providing a magnetoresistive random-access memory bit cell array for the hybrid cache architecture by:

providing a first plurality of magnetoresistive random-access memory bit cells and a second plurality of magnetoresistive random-access memory bit cells; and coupling the first plurality of magnetoresistive random-access memory bit cells to the second plurality of magnetoresistive random-access memory bit cells; and providing a differential sense amplifier and a single-ended sense amplifier; and coupling at least one magnetoresistive random-access memory bit cell in the first plurality of magnetoresistive random-access memory bit cells to the single-ended sense amplifier and at least two magnetoresistive random-access memory bit cells in the second plurality of magnetoresistive random-access memory bit cells to the differential sense amplifier, wherein providing the magnetoresistive random-access memory bit cell array comprises providing a uniform magnetoresistive random-access memory bit cell array such that a number of magnetoresistive random-access memory bit cells in each column of the first plurality of magnetoresistive random-access memory bit cells is same as a number of magnetoresistive random-access memory bit cells in each column of the second plurality of magnetoresistive random-access memory bit cells, wherein the differential sense amplifier is provided to output a single data bit by sensing currents from at least two magnetoresistive random-access bit cells, and wherein the single-ended sense amplifier is provided to output a single data bit by sensing a current from a single magnetoresistive random-access bit cell.

9. The method for manufacturing the hybrid cache architecture of claim 8, wherein providing the differential sense amplifier and the single-ended sense amplifier comprises providing the differential sense amplifier and the single-ended sense amplifier in a non-uniform configuration.

10. The method for manufacturing the hybrid cache architecture of claim 8, wherein providing the magnetoresistive random-access memory bit cell array comprises providing a Spin Torque Transfer magnetoresistive random-access memory array.

11. The method for manufacturing the hybrid cache architecture of claim 8, wherein providing the magnetoresistive random-access memory bit cell array comprises providing a Toggle magnetoresistive random-access memory array.

12. The method for manufacturing the hybrid cache architecture of claim 8, further comprising coupling the single-ended sense amplifier to a reference cell.

13. A method for manufacturing a hybrid cache architecture, the method comprising:
  step for providing a magnetoresistive random-access memory bit cell array by:
    step for providing a first plurality of magnetoresistive random-access memory bit cells and a second plurality of magnetoresistive random-access memory bit cells in the hybrid cache architecture; and
    step for coupling the first plurality of magnetoresistive random-access memory bit cells to the second plurality of magnetoresistive random-access memory bit cells;
  step for providing a differential sense amplifier and a single-ended sense amplifier; and
  step for coupling at least one magnetoresistive random-access memory bit cell in the first plurality of magnetoresistive random-access memory bit cells to the single-ended sense amplifier and at least two magnetoresistive random-access memory bit cells in the second plurality of magnetoresistive random-access memory bit cells to the differential sense amplifier, wherein the step for providing the magnetoresistive random-access memory bit cell array comprises step for providing a uniform magnetoresistive random-access memory bit cell array such that a number of magnetoresistive random-access memory bit cells in each column of the first plurality of magnetoresistive random-access memory bit cells is same as a number of magnetoresistive random-access memory bit cells in each column of the second plurality of magnetoresistive random-access memory bit cells, wherein the differential sense amplifier is provided to output a single data bit by sensing currents from at least two magnetoresistive random-access bit cells, and wherein the single-ended sense amplifier is provided to output a single data bit by sensing a current from a single magnetoresistive random-access bit cell.

14. The method of claim 13, wherein the step for providing the differential sense amplifier and the single-ended sense amplifier comprises step for providing the differential sense amplifier and the single-ended sense amplifier in a non-uniform configuration.

15. The method of claim 13, wherein the step for providing the magnetoresistive random-access memory bit cell array comprises step for providing a Spin Torque Transfer magnetoresistive random-access memory array.

16. The method of claim 13, wherein the step for providing the magnetoresistive random-access memory bit cell array comprises providing a Toggle magnetoresistive random-access memory array.

17. The method of claim 13, further including step for coupling the single-ended sense amplifier to a reference cell.

18. The method of claim 13, wherein a portion of the magnetoresistive random-access memory bit cell array having the first plurality of magnetoresistive random-access memory bit cells coupled to the single-ended sense amplifier is slower than a portion of the magnetoresistive random-access memory bit cell array having the second plurality of magnetoresistive random-access memory bit cells coupled to the differential sense amplifier.

19. An apparatus, comprising
  a hybrid cache architecture, comprising:
    a magnetoresistive random-access memory bit cell array having a first plurality of magnetoresistive random-access memory bit cells and a second plurality of magnetoresistive random-access memory bit cells coupled to the first plurality of magnetoresistive random-access memory bit cells;
  means for sensing, in a differential manner, at least two magnetoresistive random-access memory bit cells in the second plurality of magnetoresistive random-access memory bit cells; and
  means for sensing, in a single-ended manner, at least one magnetoresistive random-access memory bit cell in the first plurality of magnetoresistive random-access memory bit cells, wherein the magnetoresistive random-access memory bit cell array is uniform such that a number of magnetoresistive random-access memory bit cells in each column of the first plurality of magnetoresistive random-access memory bit cells is same as a number of magnetoresistive random-access memory bit cells in each column of the second plurality of magnetoresistive random-access memory bit cells, wherein the means for sensing, in the differential manner, outputs a single data bit by sensing currents from at least two magnetoresistive random-access bit cells, and wherein the means for sensing, in the single-ended manner, outputs a single data bit by sensing a current from a single magnetoresistive random-access bit cell.

20. The hybrid cache architecture of claim 19, wherein a configuration for the means for sensing, in the differential manner, the at least two magnetoresistive random-access memory bit cells and the means for sensing, in the single-ended manner, the at least one magnetoresistive random-access memory bit cell is non-uniform.

21. The hybrid cache architecture of claim 19, wherein the magnetoresistive random-access memory bit cell array is a Spin Torque Transfer magnetoresistive random-access memory array.

22. The hybrid cache architecture of claim 19, wherein the magnetoresistive random-access memory bit cell array is a Toggle magnetoresistive random-access memory array.

23. The hybrid cache architecture of claim 19, wherein the means for sensing, in the single-ended manner, the at least one magnetoresistive random-access memory bit cell is further coupled to a reference cell.

24. The hybrid cache architecture of claim 19, wherein a portion of the magnetoresistive random-access memory bit cell array having the first plurality of magnetoresistive random-access memory bit cells coupled to the means for sensing, in the single-ended manner, the at least one magnetoresistive random-access memory bit cell is slower than a portion of the magnetoresistive random-access memory bit cell array having the means for sensing, in the differential manner, the at least two magnetoresistive random-access memory bit cells.

25. The apparatus of claim 19, wherein the hybrid cache architecture is integrated in at least one semiconductor die.

26. The apparatus of claim 1,
wherein each of the first plurality of magnetoresistive random-access memory bit cells comprises a transistor in series with a magnetic tunnel junction, and
wherein each of the second plurality of magnetoresistive random-access memory bit cells comprises a transistor in series with a magnetic tunnel junction.

27. The method for manufacturing the hybrid cache architecture of claim 8, wherein the magnetoresistive random-access memory bit cell array is provided such that
each of the first plurality of magnetoresistive random-access memory bit cells comprises a transistor in series with a magnetic tunnel junction, and
each of the second plurality of magnetoresistive random-access memory bit cells comprises a transistor in series with a magnetic tunnel junction.

28. The method for manufacturing the hybrid cache architecture of claim 13, wherein the magnetoresistive random-access memory bit cell array is provided such that
each of the first plurality of magnetoresistive random-access memory bit cells comprises a transistor in series with a magnetic tunnel junction, and
each of the second plurality of magnetoresistive random-access memory bit cells comprises a transistor in series with a magnetic tunnel junction.

29. The apparatus of claim 1,
wherein each of the first plurality of magnetoresistive random-access memory bit cells comprises a transistor in series with a magnetic tunnel junction, and
wherein each of the second plurality of magnetoresistive random-access memory bit cells comprises a transistor in series with a magnetic tunnel junction.

30. The apparatus of claim 1,
wherein the plurality of sense amplifiers comprise a plurality of single-ended sense amplifiers, and
wherein each column of the first plurality of magnetoresistive random-access memory bit cells is coupled to a different one of the plurality of single-ended sense amplifiers.

31. The method for manufacturing the hybrid cache architecture of claim 8,
wherein a plurality of single-ended sense amplifiers are provided, and
wherein each column of the first plurality of magnetoresistive random-access memory bit cells is coupled to a different one of the plurality of single-ended sense amplifiers.

32. The method for manufacturing the hybrid cache architecture of claim 13,
wherein a plurality of single-ended sense amplifiers are provided, and
wherein each column of the first plurality of magnetoresistive random-access memory bit cells is coupled to a different one of the plurality of single-ended sense amplifiers.

33. The apparatus of claim 1,
wherein the plurality of sense amplifiers comprise a plurality of single-ended sense amplifiers, and
wherein each column of the first plurality of magnetoresistive random-access memory bit cells is coupled to a different one of the plurality of single-ended sense amplifiers.

* * * * *